United States Patent
Feldman et al.

(10) Patent No.: US 8,788,895 B2
(45) Date of Patent: Jul. 22, 2014

(54) TESTING SYSTEM FOR INTEGRATED CIRCUITS INCLUDING COMPONENTS FOR RECEIVING CLOCK SIGNALS CORRESPONDING TO DIFFERENT CLOCK DOMAINS

(75) Inventors: Nelly Feldman, Marseille (FR); Stefano Catalano, Catania (IT)

(73) Assignees: STMicroelectronics S.r.l., Agrate Brianza (MI) (IT); STMicroelectronics (Rousset) SAS, Rousset (FR)

( * ) Notice: Subject to any disclaimer, the term of this patent is extended or adjusted under 35 U.S.C. 154(b) by 747 days.

(21) Appl. No.: 13/050,611

(22) Filed: Mar. 17, 2011

(65) Prior Publication Data

US 2011/0248720 A1  Oct. 13, 2011

(51) Int. Cl.
*G01R 31/28* (2006.01)

(52) U.S. Cl.
USPC .......................................... 714/726; 714/733

(58) Field of Classification Search
CPC ............................................... G01R 31/318547
USPC ................... 714/726, 729, 731, 735
See application file for complete search history.

(56) References Cited

U.S. PATENT DOCUMENTS

| | | | |
|---|---|---|---|
| 6,715,093 B1 | 3/2004 | Farmer et al. | |
| 7,500,165 B2 | 3/2009 | Guettaf | |
| 7,640,475 B2 * | 12/2009 | Ravikumar et al. | 714/731 |
| 7,689,885 B2 * | 3/2010 | Kaibel et al. | 714/731 |
| 8,055,965 B2 * | 11/2011 | Kaneko | 714/729 |
| 8,145,958 B2 * | 3/2012 | Aitken et al. | 714/718 |
| 8,327,205 B2 * | 12/2012 | Waayers et al. | 714/731 |
| 8,352,816 B2 * | 1/2013 | Swoboda | 714/726 |
| 8,464,117 B2 * | 6/2013 | Rakheja et al. | 714/731 |
| 2005/0022083 A1 | 1/2005 | Wu | |
| 2005/0055614 A1 | 3/2005 | Yeh | |
| 2008/0282122 A1 * | 11/2008 | Guettaf | 714/731 |

OTHER PUBLICATIONS

Italian Search Report on Patent Application No. TO2010A000268, mailed Nov. 22, 2010, pp. 9.

* cited by examiner

*Primary Examiner* — Esaw Abraham
(74) *Attorney, Agent, or Firm* — Hogan Lovells US LLP

(57) ABSTRACT

A system for testing an integrated circuit including components for receiving clock signals corresponding to different clock domains includes a pin of the integrated circuit to receive a test clock signal for components included in different clock domains, clock gating cells integrated in the integrated circuit to direct said test clock signal from the pin towards components included in respective clock domains and, coupled to each of the gating cells, a dedicated flip-flop for a respective clock domain, the dedicated flip-flop being also integrated in the integrated circuit to effect on the cell to which it is coupled a clock gating function during testing of the integrated circuit.

14 Claims, 6 Drawing Sheets

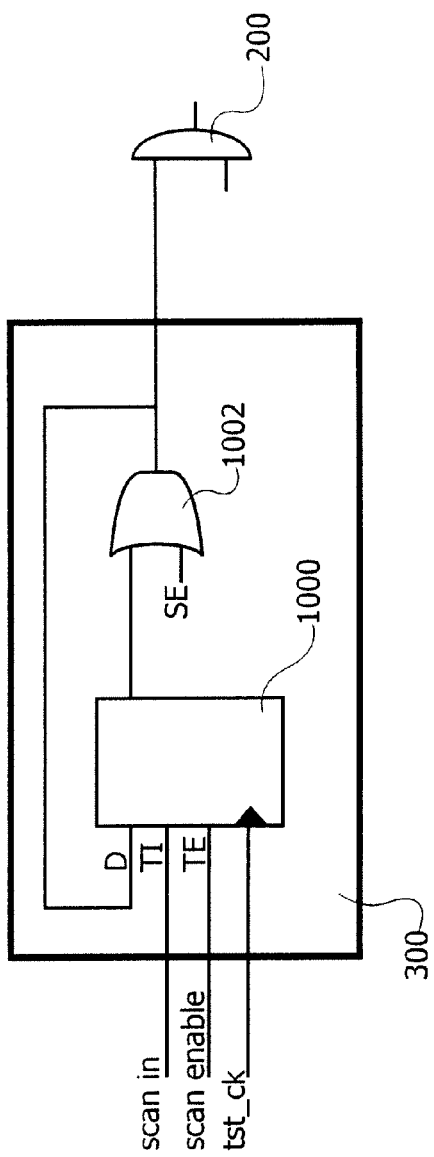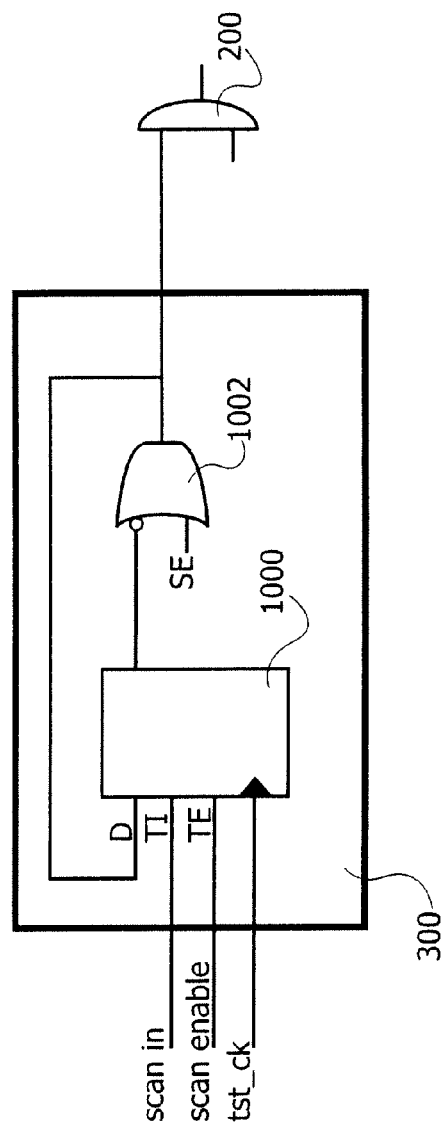

TESTING SYSTEM FOR INTEGRATED CIRCUITS INCLUDING COMPONENTS FOR RECEIVING CLOCK SIGNALS CORRESPONDING TO DIFFERENT CLOCK DOMAINS

RELATED APPLICATION

The present application claims priority of Italian Patent Application No. TO2010A000268 filed Apr. 8, 2010, which is incorporated herein in its entirety by this reference.

BACKGROUND OF THE INVENTION

1. Field of the Invention

This present invention relates to techniques for testing integrated circuits, and, more particularly to "shift mode" and "capture mode" test modes that are currently employed in the integrated circuit industry, particularly for consumer electronics.

2. Description of the Related Art

In the manufacture of integrated circuits, particularly of highly complex integrated circuits, the need arises to perform test operations on the components which constitute the circuit.

Specifically, test techniques are known such as "scan testing", wherein, instead of performing a functional test at the integrated circuit level, tests are performed aiming at verifying the structure correctness.

In an integrated circuit there may be provided as many as a million flip-flops and more, and the most widespread methods consider the circuit as a group of interconnected functional blocks. This makes it possible, for example, to design components, such as the flip-flops included in a single functional block, in such a way as to allow them to be connected with one another in a so-called scan path in order to undergo testing. Beside the inputs and outputs employed during a normal operation of the circuit, the flip-flops included in such a scan path include, therefore, additional terminals or pins, such as the ones named Scan Input (SI) and Scan Enable input (SE). The flip-flops included in a scan path are connected with their outputs to the SI input of the following flip-flop. The first flip-flop in the path receives an input stimulus from an automatic test unit through an access terminal to the chip of the integrated circuit. The last flip-flop in the scan path gives in turn its output to the automatic test unit through a corresponding test access terminal. Within a single integrated circuit there may be several scan paths.

FIG. 1 of the annexed drawings shows, by way of example, a scan path comprising a plurality of flip-flops 100, 102, 104, . . . (these flip-flops may be present in any rated number). Flip-flop 100 is assumed to be the first flip-flop in the scan path, while flip-flop 104 is considered to be ideally the last flip-flop. Logic blocks 120 are interposed between the individual flip-flops; they are assumed to be interposed between the output Q of the flip-flop upstream and the input D of the flip-flop downstream.

In FIG. 1 there are shown the previously mentioned SI and SE inputs, which are assumed to be ideally connected:
the SI (Scan Input) input to a scan input contact point, and
the SE (Scan Enable) input to a scan enable contact point.

For the subsequent flip-flops (e.g. flip-flops 102 and 104), while keeping the connection of the SE input to the scan enable contact point, the SI input of the individual flip-flop is connected to the output of the flip-flop upstream. For instance, in the shown example, the SI input of flip-flop 102 is connected to output Q, denoted by 100*b*, of flip-flop 100, while the SI input of flip-flop 104 is connected to output Q, denoted by 102*b*, of flip-flop 102. Clock inputs 100*a*, 102*a* and 104*a* are also shown in FIG. 1.

In this respect, it is to be remarked once again that the view in FIG. 1 is deliberately schematic in its essential elements: a scan path of the depicted kind generally comprises a much higher number of mutually cooperating flip-flops.

In particular, in order to perform the scan testing, it is possible to operate according to two different methods, which are known as shift mode and capture mode.

In the shift mode, flip-flops process what they receive at their SI input. The scan enable contact point acts as an interface for the automatic test unit, and allows the test unit to deliver a signal adapted to set the flip-flop into a shift mode.

In the capture mode, the flip-flops process the input signals received on input D, as it happens in the normal operating mode. In various embodiments, in order to shift to the capture mode a low level signal is applied on the SE input of the flip-flop.

What has been said substantially corresponds to operating information and modes which are known in the state of the art, as reported for example in US-A-2006/0075297 (U.S. Pat. No. 7,500,165).

This document acknowledges the fact that the described techniques require the dedication of external pins of the integrated circuit to the scan testing function, in order to allow the connection to the automatic test devices.

Although use is not made of a plurality of external pins dedicated to the test by resorting to the functional pins being shared and having a specific meaning in test mode, in any case the need is felt to limit the number of external pins used; this is due to various different reasons:
a low functional pin count is available,
the necessary hardware for the test should be reduced (channels of the testing device),
with the same number of channels, parallelism (the number of simultaneously tested devices) should be increased, and
generally speaking, it is desirable to minimize the number of external pins dedicated to testing, so as to reduce dimensions and/or to dedicate a higher number of pins to the circuit functions.

Moreover, the number of internal clocks of an integrated circuit has an impact on the number of external pins. In a currently employed chip there may be as many as hundreds of different "clock domains", which phrase indicates a set of flip-flops and logic circuits that use the same clock. This fact may cause further difficulties in relation to a possible use of a common gate or a common flip-flop. Actually, there may exist independent clock domains, i.e. clock domains that do not interfere with one another in any way, in a situation wherein the internal clocks supporting them may have different operating frequencies, which fact involves having for each clock domain a respective external pin supporting the testing function. This is a further difficulty as regards the soaring number of test pins.

Specifically, the diagram in FIG. 2 depicts a typical situation where the need exists to handle several internal clocks with different frequencies. These frequencies may correspond, for example, to the operating frequencies of various clock generators, denoted by CK1, CK1', CK2, CK3, etc.

By way of example and not of limitation of the scope of the present disclosure, generator CK1 may be, for example, a PLL operating at an exemplary frequency of 72 MHz, with an associated divisor by two, which practically acts as a further clock generator CK1' operating at a frequency of 36 MHz, corresponding to half the frequency generated by generator CK1. Similarly, generator CK2 can be an oscillator of any kind, operating for example at a frequency of 25 MHz, while clock generator CK3 may be an oscillating circuit RC, operating at a frequency of 16 MHz. The reported frequency values obviously have an exemplary value, and the choice of their respective value aims at highlighting that such clock signals and the related clock domains may operate at any frequency, without imposing or assuming any dependence constraint of such frequencies.

FIG. 2 refers mainly to the normal operating mode (without testing) of the device, and highlights the fact that the various clock domains, if necessary, can be "turned off" through clock gating cells 200, integrated in the circuit that must undergo testing.

Cells 200 are subjected to control or enable (EN) signals and can comprise e.g. AND gates with two inputs, which respectively receive:

on one input, the clock signal CK1, CK1', CK2, CK3, and on the other input, the EN signal.

As a consequence, if the EN signal is at level "1", the clock domain is active, and therefore the clock signal is supplied to flip-flops 100, 102, 104, . . . ; if the EN signal is at level "0", the clock domain is off.

For the sake of clarity it should be noted that, in the solution considered in FIG. 2, the control or enable signal EN is to be distinguished from the scan enable signal SE.

In order to test the circuit, the structure depicted in FIG. 2 is adapted to be implemented, according to conventional solutions, with two different approaches, that are respectively illustrated in FIG. 3 and in FIG. 4. In these two Figures, parts and components identical or equivalent to parts and components already described with reference to FIGS. 1 and 2 are denoted by the same reference numbers, and the description thereof will be omitted.

Specifically, the solution in FIG. 3 involves the use of plural pins, one for each test clock tst_ck1, tst_ck2, tst_ck3, tst_ck4, in order to solve the set up/hold issue among the various clock domains. Upstream each cell 200, on the input that must receive the clock signal CK1, CK1', CK2, CK3, a multiplexer 202 is arranged which operates under the control of a test_mode signal. When the test_mode signal shows that the circuit is being tested, multiplexers 202 send, in place of the signal CK1, CK1', CK2, CK3, a corresponding signal tst_ck1, tst_ck2, tst_ck3, tst_ck4 to the cells 200.

The solution in FIG. 4 involves, on the contrary, the use of a single pin common to all clock domains, on which a test clock signal tst_ck is present. In this case as well, upstream each cell 200, on the input that must receive the clock signal CK1, CK1', CK2, CK3, a multiplexer 202 is arranged which operates under the control of a test_mode signal. When the test_mode signal indicates that the circuit is being tested, multiplexers 202 send, in place of the signal CK1, CK1', CK2, CK3, a signal tst_clk to the cells 200. In this case the need arises to handle timing issues among the different clock signals.

The firm Synopsis, Mountain View, Calif., USA offers a software tool that can be used in a design environment for integrated circuits and that is known as DFT_COMPILER. Such a tool includes an application named OCC (On-Chip Clocking) that is adapted to manage various internal clocks of a circuit during a test operation.

SUMMARY OF THE INVENTION

The inventors have observed that the solution previously considered with reference to FIGS. 2 and 4 suffers from some major drawbacks.

Specifically, in the case that one pin for each clock domain is employed, the number of necessary pads to handle a corresponding number of different clock domains increases, which fact results in a lower ability to operate in parallelism.

If a common pin is used for all clock domains, a problem arises concerning the clock rate of the different clock domains, with the addition of the fact that a rather long processing time is required in order to generate the corresponding test patterns.

The inventors have moreover observed that also the previously mentioned tool, which can handle various internal clocks of a circuit during a testing operation, shows various disadvantages, for example a negative impact on the synthesis of so-called clock trees, and makes the circuit heavier in terms of area overhead.

The object of the invention is to avoid the previously discussed drawbacks.

According to the present invention, such an object is achieved thanks to a system having the features set forth in the claims that follow.

The claims are an integral part of the technical teaching of the invention provided herein.

In various embodiments, the presently described solution allows the use of a single external pin, a feature that is particularly advantageous in the case of an "at speed scan test", being able to use a flip-flop which handles any clock domain.

BRIEF DESCRIPTION OF THE DRAWINGS

The invention will now be described, by way of example only, with reference to the enclosed representations, wherein:

FIGS. 6 and 7 show two possible embodiment solutions according to the present invention.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
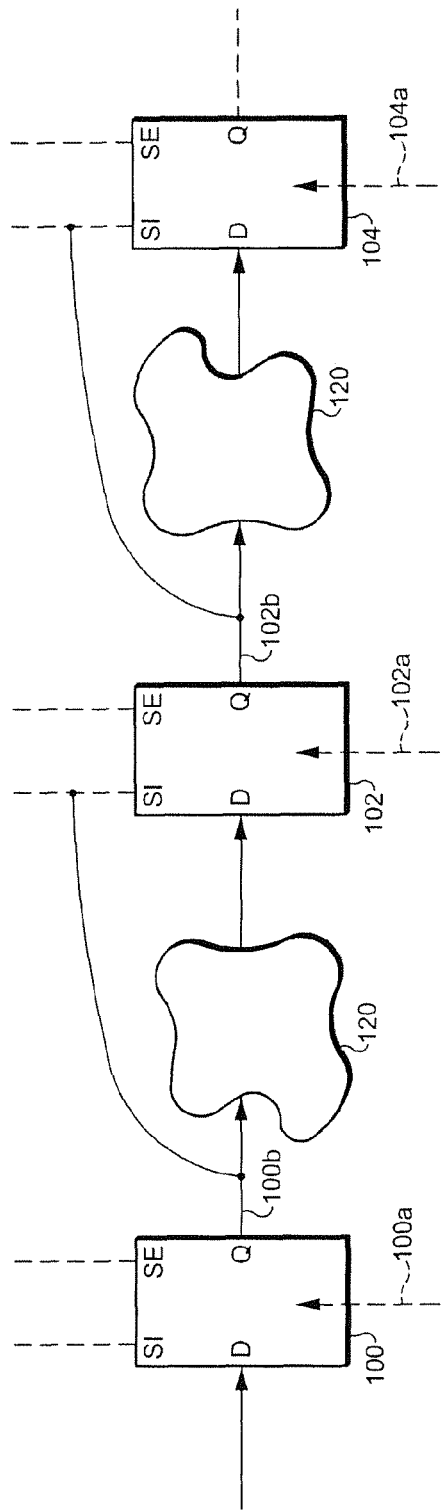
FIGS. 1 to 4 relate to the prior art and have been previously described.
Figure 4:
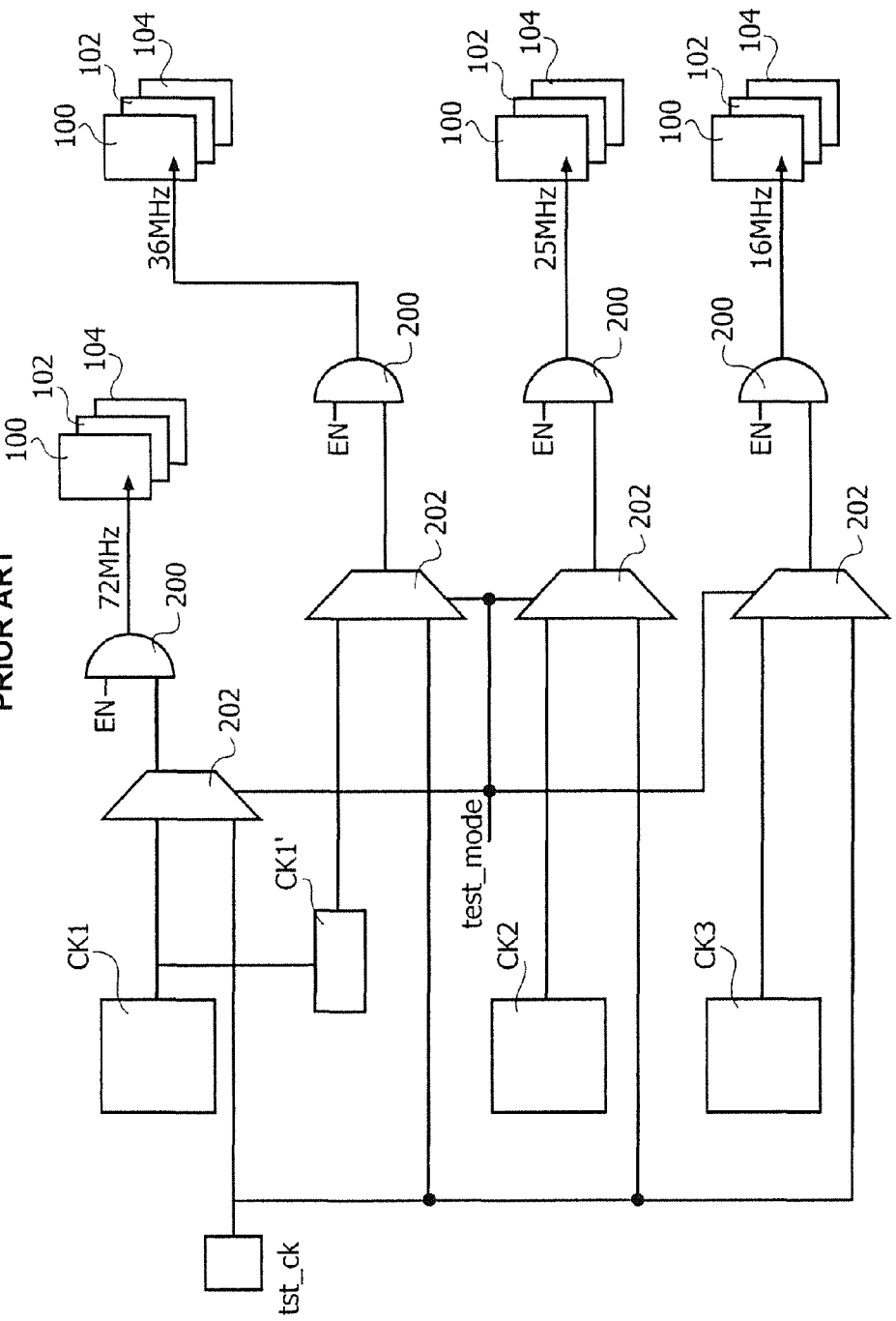
Figure 5:
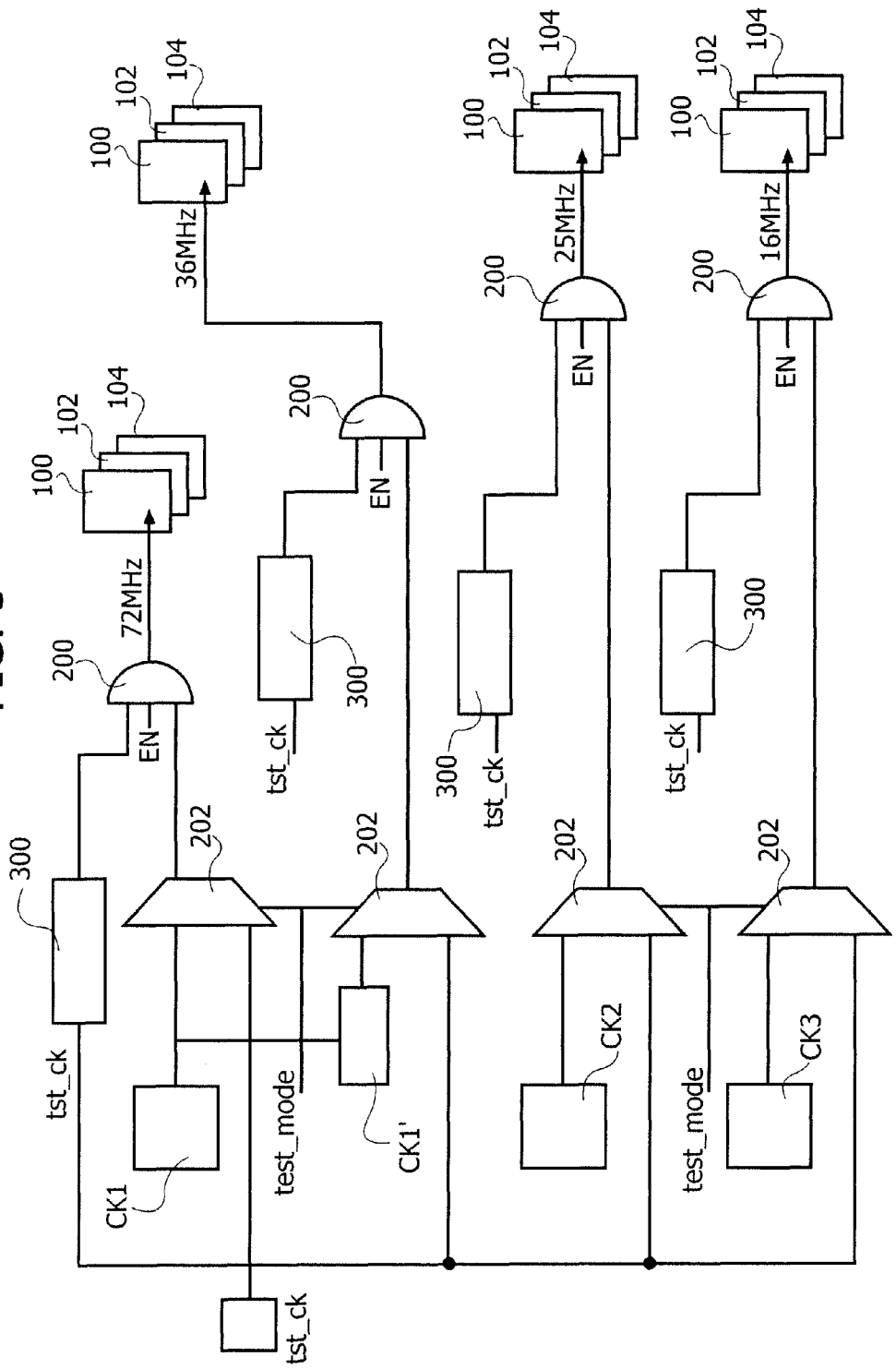
FIG. 5 shows an exemplary embodiment according to the present invention.

In FIG. 5 and in the subsequent Figures, parts and components identical or equivalent to parts and components already described with reference to FIGS. 1 and 4 are denoted by the same reference numbers, and the description thereof will be omitted.

As exemplified in FIG. 5, various embodiments can be considered as a development of the solution shown in FIG. 4. Such embodiments involve therefore the use of a single pin, common to all clock domains, on which a test signal test_clk is present, while upstream each cell 200, on the input that must receive the clock signal CK1, CK1', CK2, CK3, a multiplexer 202 is arranged which operates under the control of a test_mode signal. When the test_mode signal indicates that the circuit is being tested, multiplexers 202 send, in place of the signal CK1, CK1', CK2, CK3, a tst_clk signal to the cells 200.

In FIG. 5, the clock gating cells 200 are provided, always referring for simplicity to an implementation with an AND gate, with a further input adapted to allow the performance of a clock gating function (particularly on the tst_clk signal, sent to the cells 200 from multiplexers 202 when the test_mode signal indicates the test mode).

In various embodiments, the said further input refers to a circuit 300 which includes (see FIGS. 6 and 7) a dedicated flip-flop 1000, itself integrated in circuit being tested.

Flip-flop 1000 is adapted to perform a clock gating function at the desired frequency (for example, referring to the previously described values, and in no way by limitation, 72 MHz, 36 MHz, 25 MHz and 16 MHz).

In this way it is possible to control various clocks from a single pin, so as to perform, for example, a function of selecting a clock gating during the capture step, so as to perform an "at speed test" without encountering timing problems.

In various embodiments, depicted in particular in FIGS. 6 and 7, the signal coming from each flip-flop 1000 is supplied to the corresponding cell 200 through an OR gate 1002, interposed between flip-flop 1000 and cell 200 and having:
  as a first input, the output signal from flip-flop 1000, and
  as a second input, the scan enable signal SE which has already been discussed in the introductory section of the present disclosure.

Flip-flop 1000 receives the tst_clk signal as input. The respective inputs TI and TE on the contrary receive the scan in (SI) and scan enable (SE) signals, which have been described with reference to FIG. 1. The input D of flip-flop 1000 receives as a feedback the output of gate 1002, so as to avoid possible timing problems.

The two embodiments of FIGS. 6 and 7 differ in the following features:
  in the embodiment of FIG. 6 (mask system active low) the output signal of flip-flop 1000 is supplied to the input of the OR gate 1002 in a direct form;
  in the embodiment of FIG. 7 (mask system active high) the output signal of flip-flop 1000 is supplied to the input of the OR gate 1002 in negated form (i.e. with inverted logic).

The output of gate 1002, connected with an input of cell 200, transfers to cell 100 the signal of flip-flop 1000 subjected to gating by the signal SE.

In this way it is possible to have a dedicated flip-flop 1000 for each clock domain/frequency, and to handle the generation of patterns in a flexible way, by using the flip-flop 1000 (which is in turn adapted to be tested with the scan technique).

Figure 8:
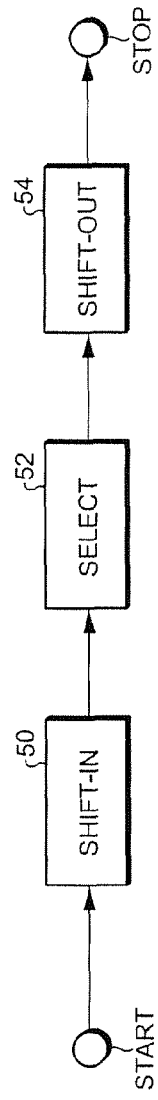
FIG. 8 is a flow diagram according to the present invention showing the ways in which the embodiments can be employed.
Figure 2:
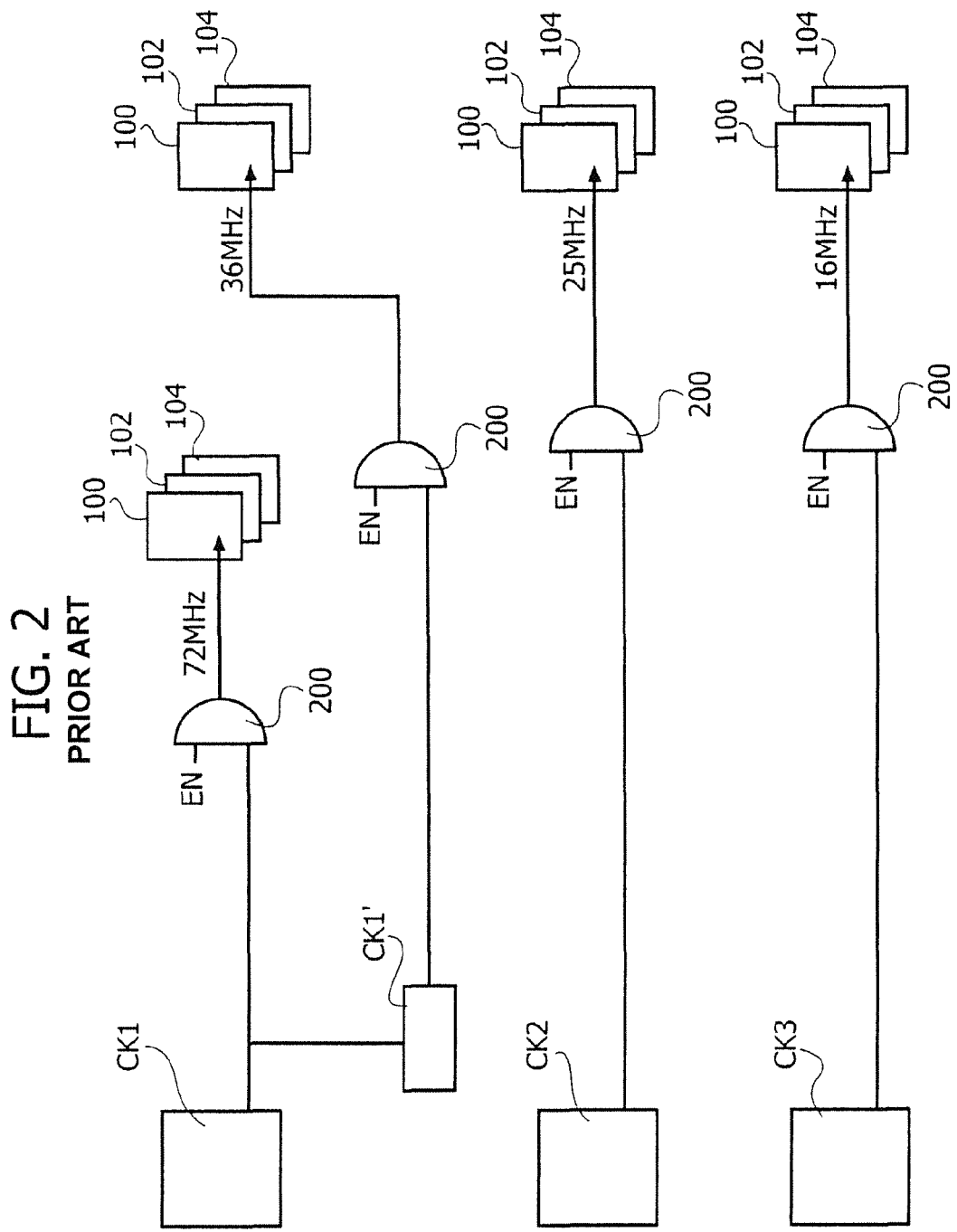
Figure 3:
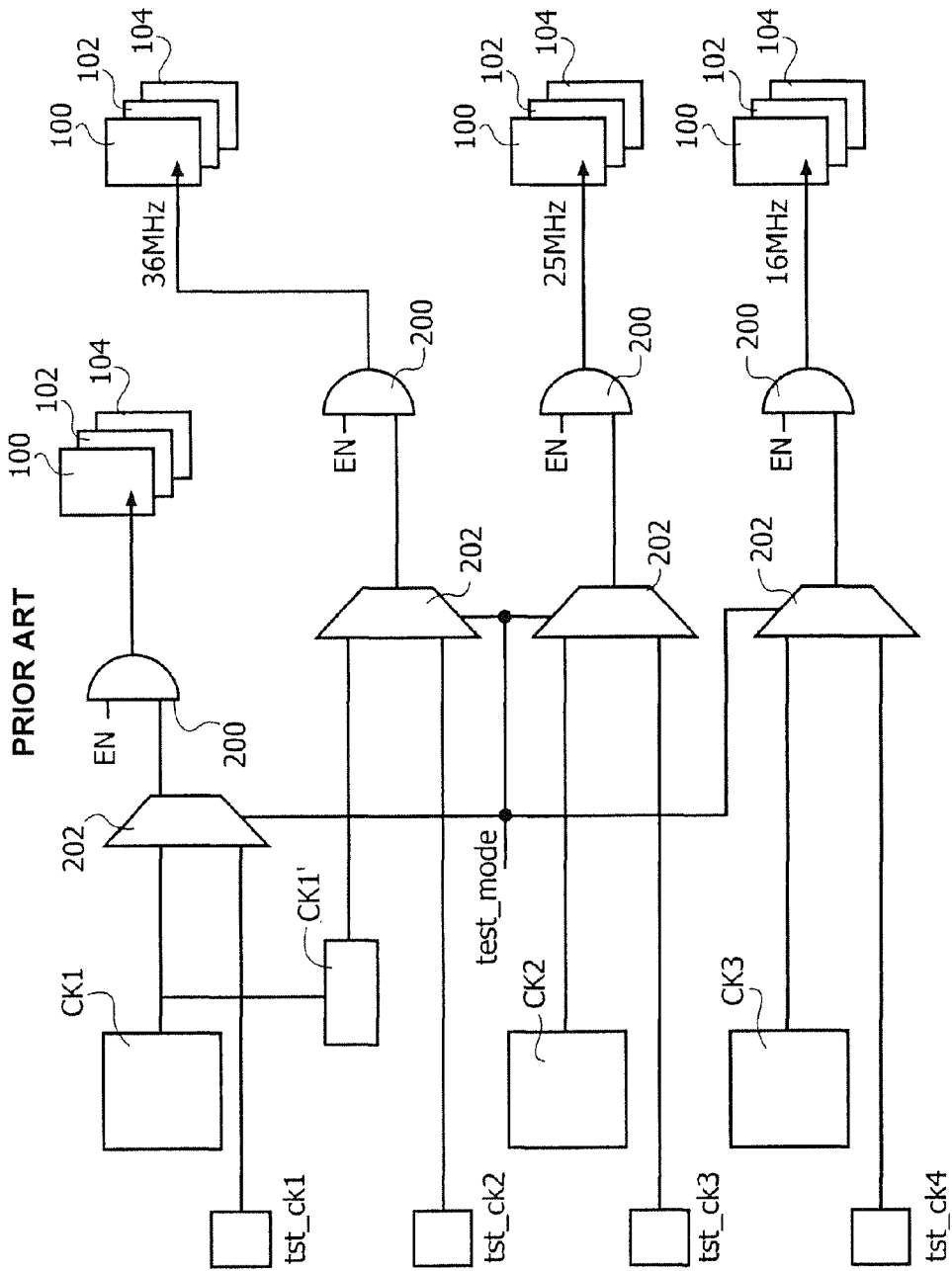

Specifically, the flow diagram in FIG. 8 shows an operating mode whereby, after a START step, in a first shift step (SHIFT-IN) 50 the flip-flops are loaded to a known value. In order to achieve this, all shift chains are carried out, i.e. all flip-flops 100, 102, 104, . . . are connected by bringing the signal SE to the value SE=1, which allows selection of the test input SI instead of the functional input D. This step 50 is therefore named shift (in), and it lasts as many clock strikes as the length of the longest scan chain in order to be able to load all flip-flops to the suitable value.

Once the device has been configured, the signal SE is brought to the value SE=0 (capture), in order to be able to select, in step 52, the input D of the flip-flops, i.e. the functional input.

Subsequently, in a second shift step (SHIFT-OUT) 54, the signal is brought back to the value SE=1, in order to reconfigure the scan chains so as to observe the capture value serially. This step 54 is perfectly equivalent to step 50, and in various embodiments steps 50 and 54 take place at the same time, because the shift-in of the new data to be loaded implies the simultaneous shift-out of the captured data.

In practice, SHIFT and CAPTURE are two subsequent scan steps that are discriminated by the SE value.

In step 54, moreover, the actually captured value is compared with the expected one, and during production all those elements showing differences are discarded.

The general criteria for the execution of a test of the presently described type are anyway generally known, and therefore do not require a more detailed description herein.

Various embodiments therefore allow to increase the parallelism in the system, because only one clock pin is needed to receive a clock signal from the outside, because the selective gating function of the clock is handled within the integrated circuit (through the flip-flops 1000).

The area overhead is not excessive, as the overall addition only includes one single flip-flop and a gate, such as OR gate 1002, for each clock domain, which has a positive effect on the consumption, too.

Various embodiments have a negligible impact on the function of clock tree synthesis, as it is also possible to execute tests on inter-clock domains.

All these features are embodied in a solution of simple implementation, with the further advantage of time saving in the development flow as compared to the solution involving a test clock for each clock domain.

Of course, without prejudice to the underlying principles of the invention, the details and the embodiments may vary, even appreciably, with respect to what has been described by way of example only, without departing from the scope of the invention as defined by the claims that follow.

We claim:

1. A system for testing an integrated circuit including components for receiving clock signals corresponding to different clock domains, the system including:
  a pin of the integrated circuit to receive a test clock signal for components included in different clock domains;
  clock gating cells integrated in the integrated circuit to direct said test clock signal from said pin towards components included in respective clock domains;
  coupled to each of said gating cells, a dedicated flip-flop for a respective clock domain, said dedicated flip-flop being also integrated in the integrated circuit to effect on the cell to which it is coupled a clock gating function during test of the integrated circuit; and
  a logic gate interposed between said dedicated flip-flop and said clock gating cell coupled thereto to effect a gating function based on a scan enable signal by correspondingly managing generation of test patterns for the circuit, wherein the output of said logic gate is feedback connected to the D input of said dedicated flip-flop.

2. The system of claim 1, including multiplexers controlled by a signal indicative of a test phase, to send toward said clock gating cells, in said test phase, said test clock signal in the place of one of said clock signals.

3. The system of claim 1, wherein said logic gate is an OR gate receiving said scan enable signal on an input and the output signal of said dedicated flip-flop on another input.

4. The system of claim 1, wherein said logic gate receives the un-inverted output signal of said dedicated flip-flop.

5. The system of claim 1, wherein said logic gate receives the inverted output signal of said dedicated flip-flop.

6. The system of claim 1 wherein said gating cells are AND gates.

7. An integrated circuit comprising:
- a pin for receiving a test clock signal;
- clock gating cells to direct said test clock signal from said pin towards components included in respective clock domains;
- coupled to each of said gating cells, a dedicated flip-flop for a respective clock domain, said dedicated flip-flop effecting on the cell to which it is coupled a clock gating function during testing of the integrated circuit; and
- a logic gate interposed between said dedicated flip-flop and said clock gating cell coupled thereto to effect a gating function based on a scan enable signal by correspondingly managing generation of test patterns for the circuit,
- wherein the output of said logic gate is feedback connected to the D input of said dedicated flip-flop.

8. The integrated circuit of claim 7, further comprising multiplexers controlled by a signal indicative of a test phase, to send toward said clock gating cells, in said test phase, said test clock signal in the place of one of said clock signals.

9. The integrated circuit of claim 7, wherein said logic gate comprises an OR gate receiving said scan enable signal on an input and the output signal of said dedicated flip-flop on another input.

10. The integrated circuit of claim 7, wherein said logic gate receives the un-inverted output signal of said dedicated flip-flop.

11. The integrated circuit of claim 7, wherein said logic gate receives the inverted output signal of said dedicated flip-flop.

12. The integrated circuit of claim 7 wherein said gating cells comprise AND gates.

13. A testing method for an integrated circuit comprising:
- receiving a test clock signal on a pin of the integrated circuit;
- providing clock gating cells to direct said test clock signal from said pin towards components included in respective clock domains;
- coupling to each of said gating cells, a dedicated flip-flop for a respective clock domain, said dedicated flip-flop effecting on the cell to which it is coupled a clock gating function during testing of the integrated circuit; and
- providing a logic gate interposed between said dedicated flip-flop and said clock gating cell coupled thereto to effect a gating function based on a scan enable signal by correspondingly managing generation of test patterns for the circuit,
- wherein the output of said logic gate is fed back to the D input of said dedicated flip-flop.

14. The testing method of claim 13, further comprising providing multiplexers controlled by a signal indicative of a test phase, to send toward said clock gating cells, in said test phase, said test clock signal in the place of one of said clock signals.

* * * * *

UNITED STATES PATENT AND TRADEMARK OFFICE
CERTIFICATE OF CORRECTION

PATENT NO. : 8,788,895 B2  
APPLICATION NO. : 13/050611  
DATED : July 22, 2014  
INVENTOR(S) : Nelly Feldman and Stefano Catalano Page 1 of 1

It is certified that error appears in the above-identified patent and that said Letters Patent is hereby corrected as shown below:

On the Title Page, please enter

-- (30) Foreign Application Priority Data  
                TO2010A000268      04/08/2010 --

Signed and Sealed this  
Seventh Day of October, 2014

Michelle K. Lee  
*Deputy Director of the United States Patent and Trademark Office*